(12) United States Patent
Beer

(10) Patent No.: US 6,985,390 B2
(45) Date of Patent: Jan. 10, 2006

(54) INTEGRATED MEMORY CIRCUIT HAVING A REDUNDANCY CIRCUIT AND A METHOD FOR REPLACING A MEMORY AREA

(75) Inventor: Peter Beer, Fontainbleau (FR)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/831,466

(22) Filed: Apr. 23, 2004

(65) Prior Publication Data

US 2004/0246792 A1    Dec. 9, 2004

(30) Foreign Application Priority Data

Apr. 25, 2003    (DE) ................ 103 18 771

(51) Int. Cl.
 *G11C 29/00*    (2006.01)
(52) U.S. Cl. .................. 365/200; 365/225.7; 365/201
(58) Field of Classification Search ............. 365/200, 365/225.7, 201
 See application file for complete search history.

(56) References Cited

U.S. PATENT DOCUMENTS

| | | | |
|---|---|---|---|
| 5,621,691 A | | 4/1997 | Park |
| 5,912,579 A | * | 6/1999 | Zagar et al. ............. 365/225.7 |
| 6,191,982 B1 | * | 2/2001 | Morgan ...................... 365/200 |
| 6,292,422 B1 | * | 9/2001 | Pitts ......................... 365/225.7 |

FOREIGN PATENT DOCUMENTS

| | | |
|---|---|---|
| DE | 199 54 346 A1 | 6/2001 |
| DE | 101 26 301 A1 | 12/2002 |

OTHER PUBLICATIONS

Examination Report dated Mar. 16, 2004.

\* cited by examiner

*Primary Examiner*—Huan Hoang
(74) *Attorney, Agent, or Firm*—Patterson & Sheridan, L.L.P.

(57) ABSTRACT

An integrated memory circuit having a redundancy circuit for replacing a memory area having an address by a redundant memory area assigned to the redundancy circuit and method for replacing a memory area. In one embodiment, the redundancy circuit comprises one or more fuse storage elements in which the address of the memory area which is to be replaced by the redundant memory area can be set, wherein, for the purpose of setting the address, each of the fuse storage elements may be set to a first state by the respective fuse storage element being left unchanged and set to a second state by the respective fuse storage element being permanently changed, an activation fuse storage element for activating the address stored in the fuse storage elements for replacing the memory area with the redundant memory area, and a deactivation storage element for permitting or preventing replacement of the memory area having the address by the redundant memory area, wherein the deactivation storage element is connected to the fuse storage elements in such a way as to prevent replacement of the memory area if each of the fuse storage elements has been permanently changed and set to the second state.

20 Claims, 2 Drawing Sheets

INTEGRATED MEMORY CIRCUIT HAVING A REDUNDANCY CIRCUIT AND A METHOD FOR REPLACING A MEMORY AREA

CROSS-REFERENCE TO RELATED APPLICATIONS

This application claims foreign priority benefits under 35 U.S.C. §119 to co-pending German patent application number 103 18 771.5 DE, filed Apr. 25, 2003. This related patent application is herein incorporated by reference in its entirety.

BACKGROUND OF THE INVENTION

1. Field of the Invention

The invention relates to an integrated memory circuit having a redundancy circuit for replacing an addressable memory area with a redundant memory area assigned to the redundancy circuit. The invention furthermore relates to a method for replacing an addressable memory area with a redundant memory area in an integrated memory circuit.

2. Description of the Related Art

An integrated memory circuit, in particular a DRAM memory circuit, is generally not free of defects after fabrication, i.e., defective memory cells are present throughout the memory chip, with the result that these memory chips thus cannot be used. In order to increase the yield of the integrated memory circuits after production, redundant memory areas are provided in addition to the memory areas in the integrated memory circuits.

After fabrication, the entire integrated memory circuit, including the redundant memory areas, is tested. The memory areas identified as defective are replaced by redundant memory areas. This is done with the aid of redundancy circuits which are respectively assigned to one of the redundant memory areas.

The redundancy circuits generally have a plurality of fuse storage elements, to which the address of the memory area which is to be replaced by the assigned redundant memory area can be written. The fuse storage elements are usually formed with the aid of laser fuses connected to a correspondingly assigned latch. The laser fuses are severed with the aid of a laser beam in a laser trimming process for the purpose of setting the addresses to be replaced of the memory areas which are to be replaced.

The laser fuses represent originally electrically conducting connecting lines which are vaporized with the aid of the laser beam, with the result that a previously electrically conducting connection is interrupted. The address to be replaced is thus set in such a way that a decision as to which of the laser fuses are severed and which of the laser fuses are retained unchanged is made for the laser fuses of the fuse storage elements.

The laser fuses are accessible only before the integrated memory circuits are housed. In other words, it is only after a front end test, i.e., testing of the integrated memory circuits at the wafer level, that it is possible to write settings with the aid of the laser trimming methods to the fuse storage elements. As soon as the integrated memory circuits are singulated and incorporated into the final housing, the laser fuses are no longer accessible. It is customary, therefore, to carry out a repair operation for the integrated memory circuits directly after the front end test at the wafer level.

There are cases, however, in which a plurality of repair steps are carried out. Firstly, in so-called "known good die" business, the integrated memory circuits can be supplied to the customer in a manner such that they are unpackaged or still situated on the wafer. In this case, the burn-in (i.e., the pre-aging) takes place with the non-housed integrated memory circuits. After or during the burn-in operation, a further functional test of the integrated memory circuit generally takes place, in the course of which, under certain circumstances, further defects may occur.

Since the integrated circuits continue to be accessible for a laser trimming process in this case, further repair steps may then follow. If it is ascertained in the course of the test operation after the burn-in operation that a redundant memory area which has been used for replacing a defective memory area likewise has a defect, the replacement of the conventional memory area by the redundant defective memory area can usually be reversed by means of a deactivation fuse storage element in that the deactivation fuse storage element is changed, i.e., the associated laser fuse is severed, and the defective memory area to be replaced is subsequently replaced by another, non-defective redundant memory area.

Secondly, the laser fuses will be replaced by electrical fuses (e-fuses) in the future. The e-fuses have the advantage that they can still be programmed even after housing, so that a renewed repair step can be carried out in the event of a defect occurring in a back end test operation, i.e., in the course of a test operation after housing.

The problem arises from the plurality of repair steps that the replacement of the defective memory area by the defective redundant memory area has to be reversed if, in the course of a subsequent repair step, a defect occurs on a redundant memory area which has already been used for repairing a defective memory area. For this purpose, as described above, a deactivation fuse storage element is usually provided for each redundancy circuit and, if the deactivation fuse storage element is changed permanently in its state, blocks the addressing of the defective redundant memory area if the address to be replaced is applied.

The deactivation fuse storage element provided for this purpose has to be provided for each of the redundant memory areas and requires a relatively significant area, irrespective of formation as a laser fuse storage element or as an e-fuse storage element.

SUMMARY OF THE INVENTION

It is an object of the present invention to reduce the area required on account of the deactivation fuse storage elements.

A first aspect of the present invention provides an integrated memory circuit having a redundancy circuit for replacing a memory area having an address with a redundant memory area assigned to the redundancy circuit. The redundancy circuit has one or more fuse storage elements, in which the address of the memory area which is to be replaced by the redundant memory area can be coded. For the purpose of setting the address, each of the fuse storage elements initially has a first state and can be set to a second state by a fuse element of the respective fuse storage element being permanently changed. The redundancy circuit furthermore has an activation fuse storage element for activating the address stored in the fuse storage elements. In this way, the memory area can be replaced by the redundant memory area if the corresponding address of the memory area is applied to an address bus.

One embodiment of the invention provides a deactivation storage element for selectively permitting or preventing replacement of the memory area having the address by the redundant memory area. The deactivation storage element is connected to the fuse storage elements in such a way as to prevent replacement of the memory area having the address by the redundant memory area if each of the fuse storage elements has been permanently changed, i.e., has been set to the second state.

The method according to one embodiment of the invention makes it possible to form the deactivation storage element merely as a simple storage element, e.g., a latch, and to avoid provision of a laser fuse or an e-fuse for realizing the deactivation fuse storage element. Chip area can be saved as a result. The functionality is nevertheless not significantly restricted since, after a defect identified in a back end test operation in a redundant memory area used for replacing a defective memory area, said redundant memory area can be switched off again, so that the defective memory area to be replaced can be replaced by another redundant memory area. To obviate the deactivation fuse storage element which is usually provided for correcting a defective replacement of a memory area, a deactivation storage element is provided for storing a deactivation state, so that, in the case of the deactivation state, the redundant memory area cannot be addressed by the address coded in the fuse storage elements.

For this purpose, the deactivation storage element may be connected to the fuse storage elements via a NOR gate, so that the deactivation state is stored in the deactivation storage element if each of the fuse storage elements has been permanently altered, i.e., has been set to the second state. The deactivation storage element is connected to a blocking circuit to block addressing of the redundant memory area with the address in accordance with the deactivation state.

In one embodiment, one of the fuse storage elements has a laser fuse and a latch, the latch being able to have a first state if the laser fuse is not severed, and having a second state if the laser fuse is severed. In another embodiment, one of the fuse storage elements may have an electrical fuse and a latch, the latch being able to have a first state if the electrical fuse is nonconducting, and having a second state if the electrical fuse is conducting.

In another embodiment, an address may be coded in the fuse storage elements for blocking the replacement of the defective memory area, and consequently, the memory area having the coded address cannot be replaced by means of such a redundancy circuit. For replacement of a defective memory area by a redundant memory area to be carried out in the case of the coded address of the memory area, the integrated memory circuit includes a further redundancy circuit. The further redundancy circuit is assigned to a further redundant memory area and comprises a further deactivation storage element, formed as a deactivation fuse storage element. In the manner that is already customary in the prior art, the deactivation fuse storage element is formed in such a way that replacement of the memory area by the further redundant memory area is permitted or prevented in accordance with a permanent change or non-change of the setting of the further deactivation fuse storage element. In this way, a defective memory area at an address which is coded in the fuse storage elements in such a way that each of the fuse storage elements is permanently changed may be replaced.

A further aspect of the present invention provides a method for replacing a memory area having an address with a redundant memory area in an integrated memory circuit. One or more fuse storage elements are provided, in which the address of the memory area which is to be replaced by the redundant memory area can be set. For the purpose of setting the address, each of the fuse storage elements is initially set to a first state wherein the respective fuse storage element is left unchanged, or is set to a second state wherein the respective fuse storage element is permanently changed. An activation fuse storage element for activating the address stored in the fuse storage elements is provided, so that the memory area addressed by the address is replaced by the redundant memory area. Replacement of the memory area having the address by the redundant memory area is permitted or prevented in accordance with a deactivation signal, the deactivation signal preventing replacement of the memory area having the address by the redundant memory area if each of the fuse storage elements have been permanently changed. Because the deactivation signal is generated from the contents of the fuse storage elements, it is possible to avoid providing a deactivation fuse storage element for each of the redundant memory areas.

BRIEF DESCRIPTION OF THE DRAWINGS

A preferred embodiment of the invention is explained in more detail in conjunction with the accompanying drawings, in which.

DETAILED DESCRIPTION OF THE PREFERRED EMBODIMENT

Figure 1:
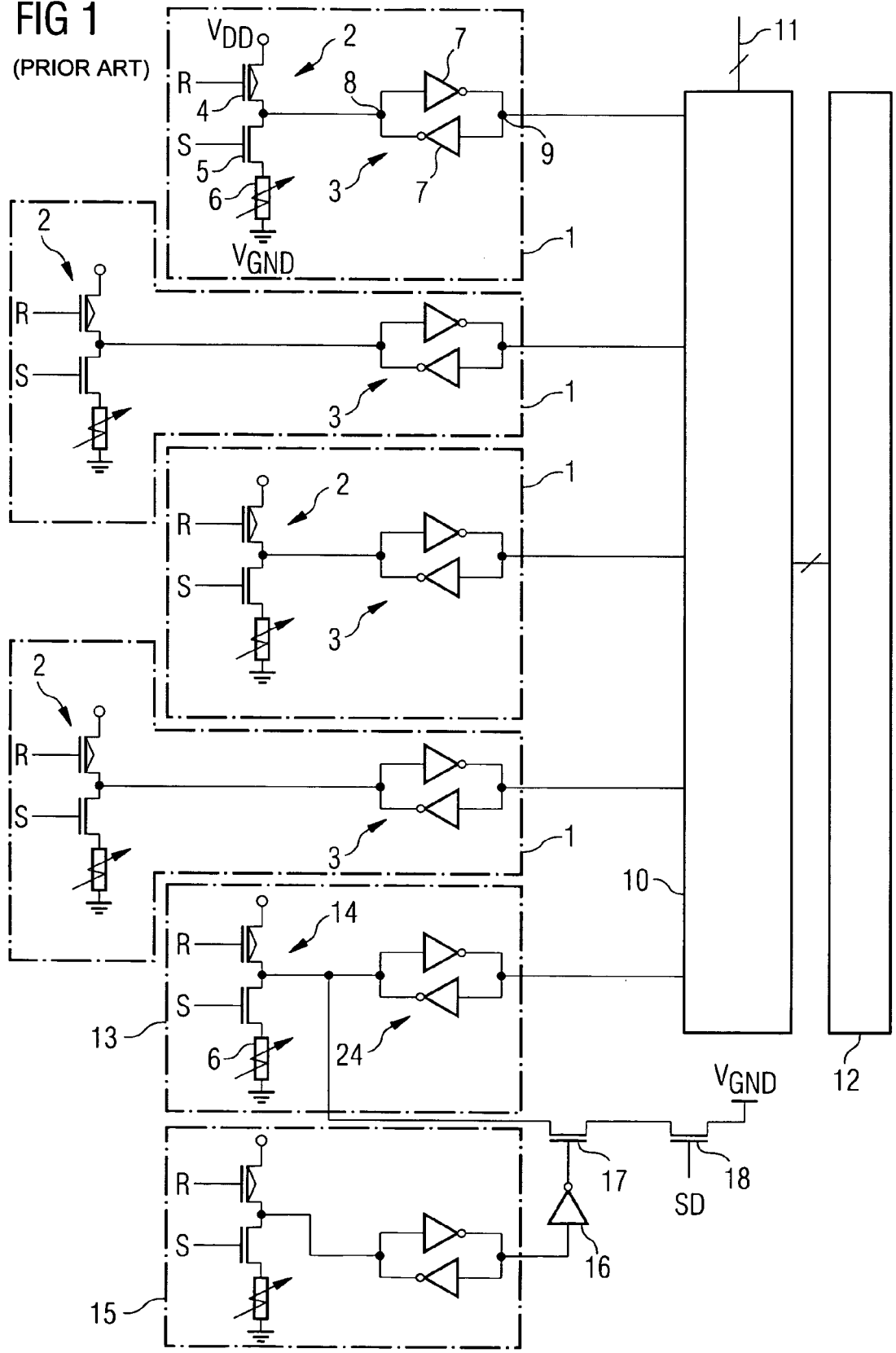
FIG. 1 shows a redundancy circuit for a redundant memory area in accordance with the prior art.

The redundancy circuit according to FIG. 1 is usually provided in an integrated memory chip. The redundancy circuit according to FIG. 1 has fused storage elements 1, which are in each case formed from a fuse circuit 2 and a fuse latch 3. The fuse circuit 2 has a first p-channel transistor 4, an n-channel transistor 5 and a laser fuse 6, which are connected in series. A first terminal of the p-channel transistor 4 is connected to a high supply voltage potential VDD. A second terminal of the first p-channel transistor 4 is connected to a first terminal of the n-channel transistor 5 and a second terminal of the n-channel transistor 5 is connected to a first terminal of the laser fuse 6. A second terminal of the laser fuse is connected to a low supply voltage potential, e.g., a ground potential VGND. A set signal S can be applied to a control input of the n-channel transistor 5 and a reset signal R can be applied to the control input of the first p-channel transistor 4 to set and reset the respective fuse latch 3.

The second terminal of the first p-channel transistor 4 or the first terminal of the n-channel transistor 5 represents an output of the fuse circuit 2, which is connected to a fuse latch 3. The fuse latch 3 essentially has two negative feedback inverters 7, which permanently accept a state level prescribed by the output of the fuse circuit 2.

The laser fuse 6 is typically formed as a metallic line which can be heated by a laser beam to an extent that the metal vaporizes or melts and the electrical connection between its two terminals is severed. In other words, the laser fuse represents an electrical connection in an original first state and the electrically conducting connection is isolated in a second state, after the laser fuse 6 has been severed during a laser trimming process.

When the integrated memory circuit is switched on or in the event of a reset, the reset signal R is activated for a length of time such that the fuse latch 3 assumes a defined state, namely a logic "1" at its first terminal 8 and a logic "0" at its second terminal 9. The set signal S is subsequently activated, so that the n-channel transistor 5 turns on and the output of the fuse circuit 2 may be pulled to the low supply voltage potential VGND depending on the state of the laser fuse 6. If the laser fuse 6 is unchanged, then the first terminal 8 of the fuse latch 3 is pulled to a ground potential, so that a logic "0" is present at the first terminal 8 of the fuse latch 3. Consequently, a logic "1" is present at the second terminal of the fuse latch 3.

In the circuit illustrated, four fuse storage elements 1 are provided, which apply a logic "1" or logic "0" at the second terminal of the fuse latch 3 depending on whether their respective laser fuses 6 are provided in conducting or nonconducting fashion. The second terminals 9 of the fuse storage elements 1 are connected to an address decoder 10. The address decoder 10 is connected to an address bus 11, so that, during the addressing of the memory chip, the address present on the address bus 11 is compared in accordance with the address prescribed by the fuse storage elements 1 and, in the event of correspondence, addresses a redundant memory area 12 connected to the address decoder 10. Data are then output from or written to the redundant memory area 12 instead of the defective memory area.

In order to activate the address coding prescribed by the fuse storage elements 1, an activation fuse storage element 13 is provided, constructed essentially identically to the fuse storage elements 1. The laser fuse 6 of an activation fuse circuit 14, which is identical to the fuse circuit 2, is severed if the address set in the fuse storage elements 1 is to be used. The activation fuse storage element 13 is usually activated only after it has been ascertained that the fuse storage elements 1 have been set correctly, in order to activate the coding of the fuse storage elements 1. In this case, a logic "0" is applied at the second terminal of an activation fuse latch 24 of the activation storage element 13.

If, in a second test operation, e.g., a back end test operation, the redundant memory area 12 which is intended to replace a defective memory area is determined to be defective, then the setting provided in the fuse storage elements 1 and in the activation fuse storage element 13 has to be deactivated such that, when the address coded in the fuse storage elements 1 is present on the address bus 11, the redundant memory area 12 is not addressed. For this purpose, a deactivation fuse storage element 15 is provided and constructed essentially identically to the fuse storage elements 1 or identically to the activation fuse storage element 13.

The deactivation fuse storage elements 15 can be set after a back end test operation in such a way that the activation of the address coded by the fuse storage elements 1 is cancelled. For this purpose, the deactivation fuse storage element 15 is connected to a control input of a second n-channel transistor 17 via an inverter 16. A first terminal of the second n-channel transistor 17 is connected to the output of the activation fuse circuit 14 of the activation fuse storage element 13. A second terminal of the second n-channel transistor 17 is connected to a first terminal of a third n-channel transistor 18. A second terminal of the third n-channel transistor 18 is connected to the low supply voltage potential VGND, which prescribes a low state for the first terminal of the activation fuse latch 24 of the activation fuse storage element 13. A control input of the n-channel transistor 18 is connected to a further set signal SD. The further set signal SD is essentially applied in such a way that the p-channel transistor 4 of the activation fuse circuit 14 of the activation fuse storage element 13 and the third n-channel transistor 18 are not turned on simultaneously. In other words, the further set signal SD must always have the state of a logic "0", in order to inhibit the third n-channel transistor 18, if the reset signal R is present at the p-channel transistor 4 of the activation fuse circuit 14.

If the laser fuse 6 of the deactivation fuse storage element 15 is severed, then a high state is present at the first terminal of the corresponding fuse latch 3, of the deactivation fuse storage element 15, so that a low level is present at the second terminal of the same fuse latch 3. This low level brings about a high level at the control input of the second n-channel transistor 17, so that the second n-channel transistor 17 is turned on. As soon as the further set signal SD likewise assumes a high state, the low supply voltage potential VGND is switched to the first terminal of the fuse latch 3 of the activation fuse storage element 13. Consequently, the second terminal of the activation fuse latch 24 of the activation fuse storage element 13 assumes a high state, so that the address coded in the fuse storage elements 1 becomes ineffective with regard to the address present on the address bus 11.

Figure 2:
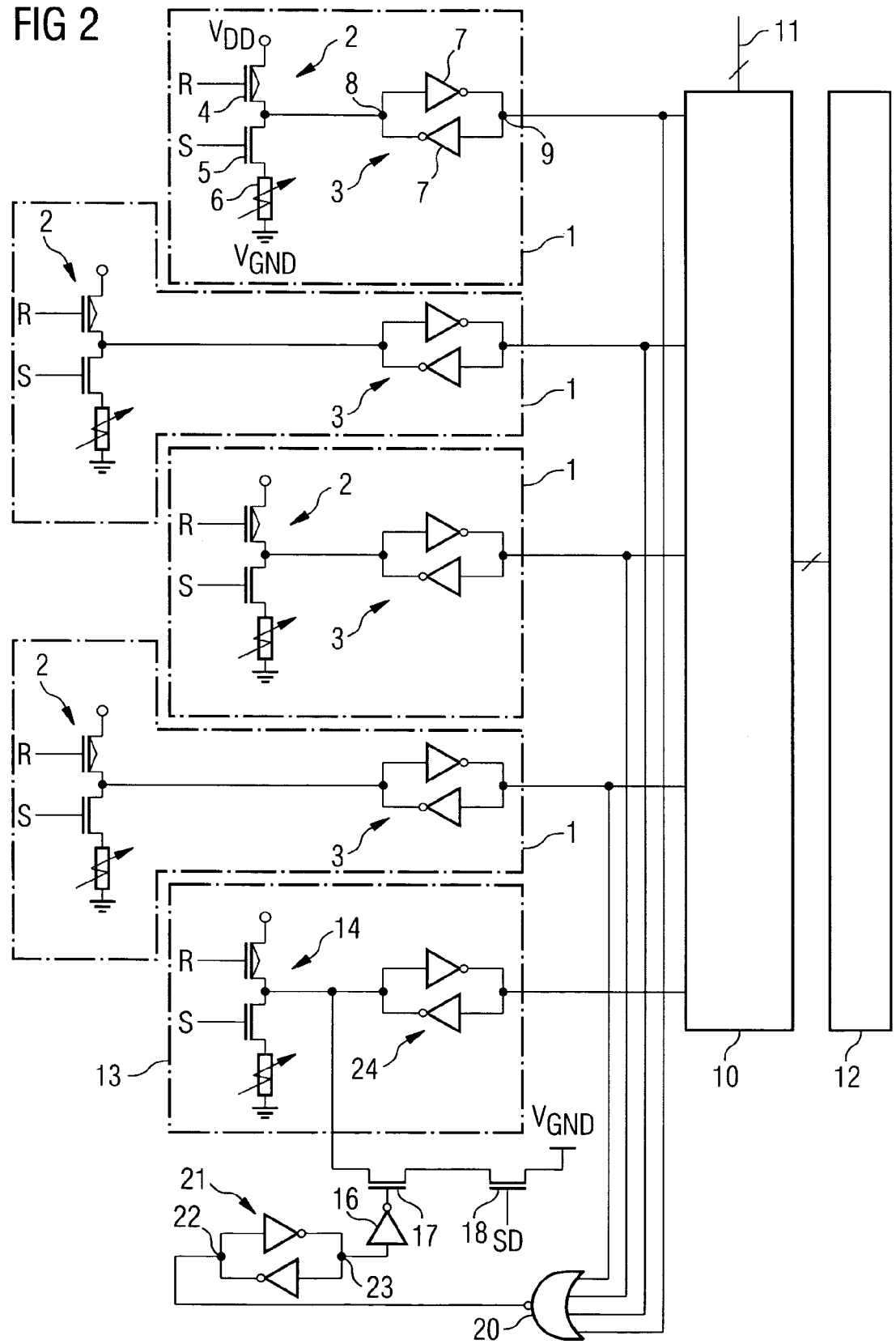
FIG. 2 shows a redundancy circuit in accordance with a preferred embodiment.

FIG. 2 illustrates a preferred embodiment of the invention. The redundancy circuit illustrated in FIG. 2 differs from the redundancy circuit illustrated in FIG. 1 in that the fuse circuit of the deactivation fuse storage element 15 is obviated. Otherwise, identical reference symbols correspond to identical components of the circuit.

Instead of the fuse circuit of the deactivation fuse storage element 15 (of FIG. 1), a NOR gate 20 is provided, which is connected to all the second terminals of the fuse latches 3 of the fuse storage elements 1. The result of the NOR operation of all the states set in the fuse storage elements 1 is applied at an output of the NOR gate 20.

The output of the NOR gate 20 is connected to the first terminal of a deactivation latch 21. The deactivation latch 21 is essentially formed identically to the fuse latches 3. A second terminal of the deactivation latch 21 is connected to the control input of the second n-channel transistor 17 via the inverter 16.

In a front end test operation, defective memory areas are identified and replaced by the redundant memory area 12 through the severing of the laser fuses 6 of the fuse storage elements 1. In order that the address coded in the fuse storage elements 1 leads to the addressing of the redundant memory 12, the activation fuse storage element 13 is blown through the severing of the laser fuse 6 of the activation fuse circuit 14, so that a logic "1" is present at the first terminal of the activation fuse latch 24 and a logic "0" is present at the second terminal of the activation fuse latch. The address decoder 10 thus knows that the address coded in the fuse storage elements 1 is to be used, so that the address present on the address bus 11 is compared with the coded address and, in the event of correspondence, the redundant memory area 12 is addressed instead of the defective memory area.

If the redundant memory area 12 is ascertained to be defective in a second test operation, e.g., a back end test operation, in order to repair the memory circuit, it is necessary to prevent the defective memory area from being replaced by the defective redundant memory area 12 when the corresponding address is present. This may be done by reversing the activation of the coded address by means of the activation fuse storage element 13. This is carried out by severing each laser fuse 6 of the fuse circuits 2 of the fuse storage elements 1, so that a logic "0" is present at each second outputs 9 of each fuse storage elements 1, which have the effect that the output of the NOR gate 20 is pulled to the state of a logic "1", so that the logic "1" is present at the first terminal 22 of the deactivation latch 21 and a logic "0" is present at the second terminal 23 of the deactivation latch 21. This has the effect that a logic "1" is present at the channel input of the second n-channel transistor 17, so that the second n-channel transistor 17 is turned on.

When the integrated memory circuit is switched on or reset, the reset signal R is activated to bring the fuse latches 3 into a defined state. Then, with the aid of the set signal S, the settings brought about as a result of severing or non-severing of the laser fuses 6 are accepted in respective fuse latches 3. Afterward, by means of the further set signal SD, a check is made to determine whether all the laser fuses 6 of the fuse storage elements 1 have been severed, wherein the further set signal SD is momentarily pulled to a low state. The third n-channel transistor 18 is thereby turned on. If all the laser fuses 6 of the fuse storage elements 1 are severed, then the second n-channel transistor 17 is also in the on state, so that a low level is present at the first terminal of the activation fuse latch 24 and the second terminal of the activation fuse latch 24 assumes a high level, and thus deactivates the previously coded setting in the fuse storage elements 1. In this way, a deactivation fuse circuit may be obviated in that it is essentially replaced by a NOR gate 20, which saves chip area in the integrated circuit.

However, with the redundancy circuit according to the invention, the address which corresponds to the setting in the fuse storage elements 1 wherein each of the laser fuses 6 has been blown cannot be replaced with a redundant memory area 12 since such a setting is interpreted as a deactivation of the previously activated setting. For this reason, at least one further redundancy circuit, which may correspond to the redundancy circuit according to FIG. 1, may be provided in an integrated memory circuit. The further redundancy circuit then comprises a deactivation fuse circuit. The further redundancy circuit is then used to replace a defective memory area having the address which corresponds to the setting of the fuse storage elements 1 wherein each of the laser fuses 6 have been severed. In this way, defects in all memory areas can be replaced by redundant memory areas.

Instead of the laser fuses, e-fuses may be provided, which, however, are nonconducting in the unchanged state and conducting in the changed state, i.e., after application of a breakdown voltage. The fuse storage elements can be adapted to the function of the e-fuses.

What is claimed is:

1. An integrated memory circuit having a redundancy circuit for replacing a memory area with a redundant memory area, the redundancy circuit comprising:
   a set of fuse storage elements for setting an address of the memory area which is to be replaced by the redundant memory area, wherein each fuse storage element is initially set to a first state and selectively set to a second state by the respective fuse storage element being permanently changed;
   an activation fuse storage element for activating the address stored in the set of fuse storage elements; and
   a deactivation storage element for preventing replacement of the memory area by the redundant memory area when each fuse storage element is set to the second state, wherein the deactivation storage element is connected to the one or more fuse storage elements to determine whether each of the fuse storage elements has been set to the second state.

2. The integrated memory circuit of claim 1, further comprising:
   a NOR gate having inputs connected to outputs of the fuse storage elements and an output connected to the deactivation storage element for storing a deactivation state in the deactivation storage element when each of the fuse storage elements has been set to the second state.

3. The integrated memory circuit of claim 2, wherein the deactivation storage element comprises a latch.

4. The integrated memory circuit of claim 2, further comprising:
   a blocking circuit for blocking addressing of the redundant memory area when the deactivation storage element is in the deactivation state.

5. The integrated memory circuit of claim 1, wherein at least one of the fuse storage elements includes a laser fuse and a fuse latch which is set to a first state if the laser fuse is not severed and set to a second state if the laser fuse is severed.

6. The integrated memory circuit of claim 1, wherein at least one of the fuse storage elements includes an electrical fuse and a fuse latch which is set to a first state if the electrical fuse is nonconducting and set to a second state if the electrical fuse is conducting.

7. The integrated memory circuit of claim 1, further comprising:
   a secondary redundancy circuit assigned to a secondary redundant memory area, wherein a secondary deactivation storage element is configured to prevent replacement of the memory area with the secondary redundant memory area except when each fuse storage element is set to the second state.

8. The integrated memory circuit of claim 7, wherein the secondary deactivation storage element comprises a deactivation fuse storage element.

9. A method for replacing a memory area having an address by a redundant memory area in an integrated memory circuit, comprising:
   setting the address of the memory area to be replaced in a set of fuse storage elements, wherein each fuse storage element is initially set to a first state and selectively set to a second state by the respective fuse storage element being permanently changed;
   activating an activation fuse storage element to replace the memory area with the redundant memory area;
   determining whether each of the fuse storage elements has been set to the second state; and
   providing a deactivation signal to prevent replacement of the memory area with the redundant memory area when each fuse storage elements is set to the second state.

10. The method of claim 9, wherein a deactivation storage element and a blocking circuit is utilized for sending the deactivation signal.

11. The method of claim 10, wherein a NOR gate is utilized to determine whether each of the fuse storage elements has been set to the second state, the NOR gate having inputs connected to outputs of the fuse storage elements and having an output connected to the deactivation storage element.

12. The method of claim 9, further comprising:
   assigning a secondary redundancy circuit to a secondary redundant memory area; and
   replacing the memory area with the secondary redundant memory area when each fuse storage element has been set to the second state and the deactivation signal has been generated to prevent replacement of the memory area with the redundant memory area.

13. A redundancy circuit for replacing a memory area of an integrated memory circuit with a redundant memory area, comprising:
   a set of fuse storage means for setting an address of the memory area which is to be replaced by the redundant memory area, wherein each fuse storage means is initially set to a first state and selectively set to a second state according to the address of the memory area to be replaced;

an activation means for activating the address stored in the set of fuse storage means and activating replacement of the memory area by the redundant memory area; and a deactivation means for deactivating replacement of the memory area by the redundant memory area when the set of fuse storage means is set to a deactivation address.

14. The redundancy circuit of claim 13, wherein the deactivation address corresponds to an address resulting from each of the fuse storage means being set to the second state.

15. The redundancy circuit of claim 14, wherein the deactivation means is connected to the one or more fuse storage means to determine whether each of the fuse storage means has been set to the second state and stores a deactivation state in the deactivation means when each of the fuse storage means has been set to the second state.

16. The redundancy circuit of claim 15, further comprising:

a NOR gate having inputs connected to outputs of the fuse storage means and an output connected to the deactivation means.

17. The redundancy circuit of claim 16, wherein the deactivation means comprises a latch.

18. The redundancy circuit of claim 17, further comprising:

a blocking circuit for blocking addressing of the redundant memory area when the deactivation state is stored in the deactivation means.

19. The redundancy circuit of claim 18, wherein each fuse storage means comprises one of:

a laser fuse and a fuse latch which is set to a first state if the laser fuse is not severed and set to a second state if the laser fuse is severed; and an electrical fuse and a fuse latch which is set to a first state if the electrical fuse is nonconducting and set to a second state if the electrical fuse is conducting.

20. The redundancy circuit of claim 18, further comprising:

a secondary redundancy circuit, assigned to a secondary redundant memory area, having a secondary deactivation means is configured to prevent replacement of the memory area with the secondary redundant memory area except when each fuse storage means is set to the second state.

* * * * *